(12) United States Patent
Hoffman

(10) Patent No.: US 7,646,797 B1
(45) Date of Patent: Jan. 12, 2010

(54) USE OF CURRENT CHANNELING IN MULTIPLE NODE LASER SYSTEMS AND METHODS THEREOF

(75) Inventor: Robert C. Hoffman, Woodstock, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 47 days.

(21) Appl. No.: 12/178,028

(22) Filed: Jul. 23, 2008

(51) Int. Cl.
*H01S 5/00* (2006.01)

(52) U.S. Cl. .................. 372/46.01; 372/19; 372/46.013; 372/46.015; 372/46.016

(58) Field of Classification Search .............. 372/19, 372/46.01–46.016
See application file for complete search history.

(56) References Cited

U.S. PATENT DOCUMENTS

| | | | |
|---|---|---|---|
| 4,819,243 | A | 4/1989 | Opschoor |
| 5,319,661 | A | 6/1994 | Irikawa et al. |
| 5,452,315 | A | 9/1995 | Kimura et al. |
| 5,543,355 | A | 8/1996 | Ookubo |
| 6,028,875 | A | 2/2000 | Knight et al. |
| 6,337,870 | B1 | 1/2002 | Furushima |
| 6,345,064 | B1 | 2/2002 | Fujii |
| 6,670,203 | B2 | 12/2003 | Furushima |
| 6,801,702 | B2* | 10/2004 | Day ............................ 385/130 |
| 6,813,298 | B2 | 11/2004 | Chan et al. |
| 6,898,228 | B2 | 5/2005 | Irino et al. |
| 2002/0039375 | A1* | 4/2002 | Shoji et al. .................... 372/46 |
| 2003/0086462 | A1 | 5/2003 | Chan et al. |
| 2003/0091300 | A1 | 5/2003 | Irino et al. |
| 2003/0235225 | A1 | 12/2003 | Glew et al. |
| 2004/0264533 | A1 | 12/2004 | Matsumura et al. |

* cited by examiner

*Primary Examiner*—Minsun Harvey
*Assistant Examiner*—Tod T Van Roy
(74) *Attorney, Agent, or Firm*—Lawrence E. Anderson

(57) ABSTRACT

Current channels, blocking areas, or strips in a semiconductor laser are used to channel injected current into the antinodal region of the optical standing wave present in the optical cavity, while restricting the current flow to the nodal regions. Previous devices injected current into both the nodal and antinodal regions of the wave, which is fed by the population inversion created in the active region by the injected electrons and holes, but inversion created in the nodal regions is lost to fluorescence or supports the creation of undesirable competing longitudinal modes, causing inefficiency. Directing current to the antinodal regions where the electric field is at its maximum causes a selected longitudinal mode to preferentially oscillate regardless of where the longitudinal mode lies with respect to the gain curve. In one embodiment, exacting fabrication of the Fabry-Perot cavity correlates the current channels to antinodal regions, vis-a vis current blocking areas, strips or segmented layers.

26 Claims, 14 Drawing Sheets

USE OF CURRENT CHANNELING IN MULTIPLE NODE LASER SYSTEMS AND METHODS THEREOF

GOVERNMENT INTEREST

The invention described herein may be manufactured, used, and licensed by or for the United States Government.

TECHNICAL FIELD

The present disclosure relates generally to optics and, more particularly, to semiconductor lasers.

DESCRIPTION OF RELATED ART

The present invention relates to an apparatus and method for manufacturing a semiconductor laser device which can be used in an optical communication system, telecommunications, CD % DVD data storage and players, diode pumped solid state lasers. The present invention is particularly useful in applications where high power/efficiency and wavelength stability are at a premium.

The typical laser comprises a gain medium positioned within a highly reflective optical cavity and a power source which supplies energy to the gain medium. The process of supplying the energy required for the amplification is called pumping. The pumping energy is typically supplied as an electrical current to the gain medium. Light is amplified by stimulated emission due to the properties of the gain medium. An optical cavity generally comprises two reflective surfaces (or mirrors) arranged such that light bounces back and forth repeatedly through the gain medium. Typically the output reflective surface is partially transparent, through which light is emitted. The other reflective surface may also be partially reflective and used in conjunction with feedback circuitry. During laser operation, light of a specific wavelength passes through the gain medium and is amplified repeatedly. A portion of the light passes through the partially transparent reflective surface and is outputted as a beam of light.

The present invention relates to laser diodes where the gain (or active) medium is a semiconductor formed from a p-n junction and powered by injected electrical current, which provides the stimulated emission. Semiconductor lasers include an active or gain layer or region by which a standing optical wave is created responsive to current flow. In a typical double heterostructure laser diode, the active layer is of low band gap material that is sandwiched between two high band gap layers. In such a laser diode, an optical waveguide is produced such that the light is confined to a relatively narrow line. The two ends are cleaved to form perfectly smooth, parallel edges, forming a Fabry-Perot resonator. Photons emitted into a mode of the waveguide will travel along the waveguide and be reflected several times from each end face before they are emitted.

Generally, the wavelength of light emitted from a semiconductor laser is a function of the band-gap of the semiconductor and the modes of the optical cavity. For example, the band-gap wavelength for InGaAsP may be on the order of approximately 1.0 to 1.115 μm, depending upon the configuration of the laser. In general, the maximum gain will occur for photons with energy slightly above the band-gap energy, and the modes nearest the gain peak will lase most strongly. If the diode is driven strongly enough, additional side modes may also lase. For example, if the oscillation wavelength is from 1100 nm to 1550 nm (or on the order of $10^{-6}$ meters), and the length of the resonator is L, the mode interval $\Delta\lambda$ of the longitudinal mode generated by the resonator of the semiconductor laser device can be expressed by the following equation, where refractive index is "n."

$$\Delta\lambda = \lambda^2/(2\,nL).$$

As the length of the resonator increases, the mode interval $\Delta\lambda$ of the longitudinal mode becomes narrower, and the selection condition(s) of the emitting the laser beam of a single longitudinal mode are more exacting. For example, U.S. Patent Application No. 2003/0091300 A1, hereby incorporated by reference, discloses a profile for a semiconductor laser device with a single longitudinal mode.

Some laser diodes, such as most visible lasers, operate at a single wavelength, but that wavelength is unstable and changes due to fluctuations in current or temperature. The present invention provides a more stable device that will permit less wavelength drift due to fluctuations in temperature.

Normally, a current (known as "injected current") flows into both the nodal and anti-nodal regions of the standing optical wave. The direction of current flow is perpendicular to optical cavity axis. The standing optical wave is fed by the population inversion created in the gain or active region by the electrons and holes provided by the injected current. The standing optical wave depletes the inversion in the anti-nodal regions in which the optical electric field is at its maximum. The inversion created in the nodal regions, however is lost to fluorescence and/or supports the creation of competing longitudinal modes, thereby resulting in lower efficiency and reduced stability.

SUMMARY

Systems and methods for emitting laser radiation are provided. The invention involves the use of current channels, or blocking areas, strips or layers in a semiconductor laser to channel the injected current into the antinode region of the optical standing wave present in the optical cavity, while restricting the current flow to the nodal regions. Normally, the injected current flows into both the node (or nodal) and anti-node (or antinodal) regions of the optical standing wave. The optical standing wave is fed by the population inversion created in the active region by the injected electrons and holes. The standing optical wave depletes the inversion in the anti-nodal regions where the electric field is at its maximum, but the inversion created in the nodal regions is lost to fluorescence or supports the creation of undesirable competing longitudinal modes. This invention increases the efficiency of the device, and causes a selected longitudinal mode to preferentially oscillate regardless of where the longitudinal mode lies with respect to the gain curve. In one embodiment of the present invention, the semiconductor laser is fabricated with exacting fabrication of the Fabry-Perot cavity so that the nodes and antinodes are properly positioned with respect to the current channels, vis-a vis the current blocking areas, strips or segmented layers. There may be on the order of one thousand nodes (e.g., 500-1500) produced vis-a vis the on the order of one thousand pairs of current blocking areas, strips or segmented layer portions so that the nodes and antinodes are properly positioned with respect to the current channels in an embodiment of the present invention. This new method of semiconductor laser is applicable to, but not limited to, the GaAlAs, AlGaInP, AlGaAsP, and InGaN diode laser material systems. In one embodiment, a p-type electrode provides an ohmic contact to the p side of the device, followed by a p-GaAs cap layer that surrounds the p-AlGaAs cladding layer. This layer forms part of the optical index waveguide that contains the laser radiation. One primary feature of this embodiment of the present invention is the placement of the n-GaAs current blocking layers (above the active layer) and p-GaAs current blocking layer (below the active layer), which may be strips, areas, or segmented layers that provide the current channeling. An AlGaAs active layer is where the stimulated recombination takes place. Lowering of the refractive index relative to the active region of the laser produces improved light confinement; i.e., restricts laser light to the active region more effectively. A standing optical wave is formed in the space between the ends of the device, which act as partially reflecting mirrors. An n-AlGaAs cladding layer provides an optical index waveguide with the p-side cladding layer. The n-GaAs buffer layer provides a transition to the n-GaAs substrate. An n-type electrode provides the device with an ohmic contact of the n-side of the device. Laser radiation is emitted from both ends of the device that act as mirrors, but generally the emission from one end is used, while the output from the opposite end is used for feedback control of the device. In one embodiment, the entire device may be approximately 0.5 mm in length and 0.25 mm in height and width. The current blocking layers are composed of highly doped p-type material on the n-side, and heavily doped n-type material on the p-side. The choice of blocking material may be varied with materials appropriate to the particular laser materials system being used. The materials used and the thickness of the layers will vary from material system to material system, but the current channeling concept can be used in all material systems. This invention has an advantage over presently known devices in that the quantum efficiency will be increased, as less current will be wasted as fluorescence. This invention also has the advantage of locking in a single pre-chosen longitudinal mode that will remain relatively fixed in wavelength with temperature. This invention fully optimizes the performance of a semiconductor laser, producing maximum quantum efficiency. It also solves the problem of wavelength drift with temperature. This invention will be useful in any application where semiconductor lasers are used, i.e., CD/DVD data storage, Diode-Pumped Solid State Lasers, telecommunications. This invention will be particularly useful for applications where high power/efficiency and wavelength stability is at a premium. The following features of this invention are believed to be novel: use of current channeling to increase efficiency, and the use of current channeling to lock in a single longitudinal mode An embodiment of a system for emitting laser radiation includes a first cladding layer, a second cladding layer, a first plurality of strips, a second plurality of strips, and an active layer. The first plurality of strips have a different level of conductivity than the first cladding layer. The second plurality of strips have a different level of conductivity than the second cladding layer. The active layer is located between the first and second cladding layers and between the first and second pluralities of strips. The active layer is configured to produce an optical wave having a plurality of nodes. Each of the plurality of nodes is located between a corresponding one of the first plurality of strips and a corresponding one of the second plurality of strips. Current channels exist between the strips which are necessarily small, and equal to $\lambda/2n$, where $\lambda$ is the wavelength, and n is the refractive index of the active layer. The number of nodes in the device will also be large, on the order of 1000. The fabrication of the present invention requires additional patterning steps to produce the channels, and requires fabrication of the Fabry-Perot cavity so that the nodes and antinodes are properly positioned with respect to the current channels.

An embodiment of a method for emitting laser radiation includes injecting a current into a laser, generating an optical wave in the laser, and restricting current flow to the nodal regions of the optical wave such that the current is channeled to the non-nodal regions of the optical wave.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Systems and methods for emitting laser radiation are provided. In this regard, an embodiment of such a system provides current blocking strips or layers in a semiconductor laser to channel the injected current into the anti-nodal regions of the standing optical wave generated by the active region of a homogeneously broadened semiconductor laser material. Such an embodiment can potentially increase efficiency, and cause a selected longitudinal mode to preferentially oscillate regardless of where the longitudinal mode lies with respect to the gain curve. This results in a more stable system that permits less wavelength drift with temperature.

By way of background, photon-emitting semiconductor lasers use of a type of semiconductor whose physical and atomic structure confers the possibility for photon emission. These photon-emitting semiconductors are the so-called "direct bandgap" semiconductors. The so-called compound semiconductors, which have virtually the identical crystal structure as silicon or germanium but use alternating arrangements of two different atomic species in a checkerboard-like pattern that break the symmetry and in doing so create the critical direct bandgap. Examples of compound semiconductors that are adapted to be used with the present invention are gallium arsenide, indium phosphide, gallium antimonide, gallium nitride and so forth, and junction diodes fabricated from these materials emit light.

Figure 1A:
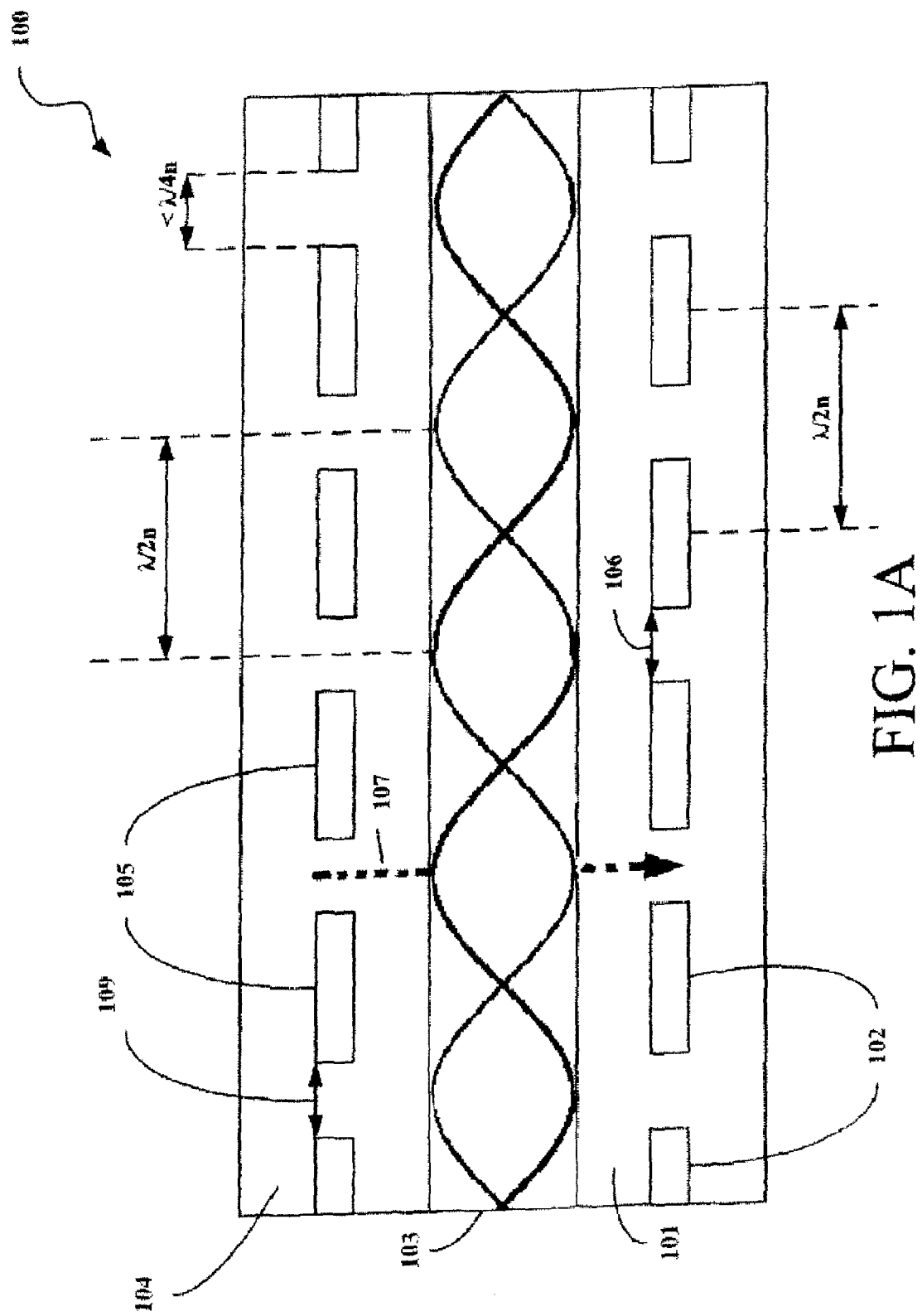
FIG. 1A is a schematic diagram depicting a cross-sectional view of an embodiment of a laser system.
Figure 1B:
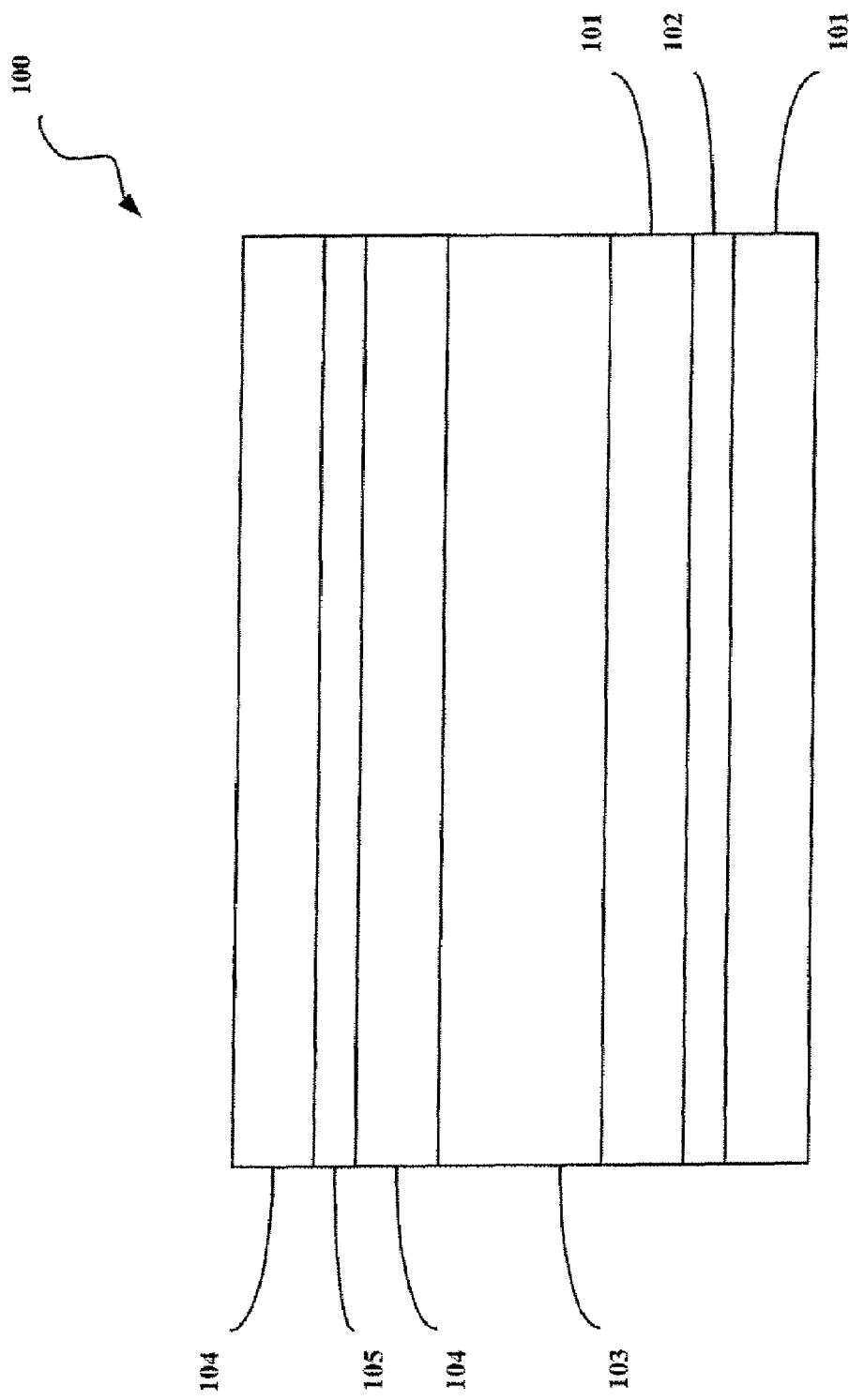
FIG. 1B is a schematic diagram depicting an end view of the embodiment shown in FIG. 1A.

FIGS. 1A and 1B are schematic diagrams depicting an embodiment of a laser system 100. FIG. 1A depicts a cross-sectional view, whereas FIG. 1B depicts an end view of the laser system 100. The laser system 100 includes cladding layers 101 and 104, an active layer 103, and current blocking areas (e.g., strips) 102 and 105. The current blocking strips 102 are located within the cladding layer 101, whereas the current blocking strips 105 are located within the cladding layer 104. The active layer 103 is located between the cladding layers 101 and 104.

The current blocking strips 102 and 105 are configured to restrict the current 107 from flowing through areas of the material located between opposing pairs of current blocking strips 102 and 105. In particular, the current blocking strips exhibit lower electrical conductivity (i.e., higher resistance) than that of the material surrounding the current blocking strips. As a result, the current 107 is channeled through gaps 106 located between adjacent current blocking strips 102 and through gaps 109 located between adjacent current blocking strips 105. This is because Ohm's law dictates that more current will flow along a path of lower resistance than along an alternative path of higher resistance.

In one embodiment, the distance between the centers of adjacent gaps 106 (and between the centers of adjacent gaps 109) is substantially equal to $\lambda/2n$, where n is the refractive index of the active layer 103, and $\lambda$ is the wavelength of the standing optical waves that the laser system 100 is configured to create. Similarly, the distance between the centers of adjacent current blocking strips 102 (and adjacent current blocking strips 105) (excluding the narrower current blocking strips 102 and 105 at the ends of the laser system, which are included to provide regions for accommodating a node at the end facet of the laser) is substantially equal to $\lambda/2n$. This restricts the current from flowing through the nodal regions of the standing optical waves since the nodal regions are located between respective opposing current strips 102 and 105. The width of each of the gaps 106 and 109 is preferably less than $\lambda/4n$. This enables the current flowing through the active layer 103 to be concentrated in the anti-nodal regions of the standing optical waves since the anti-nodal regions are located between respective opposing gaps 106 and 109.

Figure 2A:
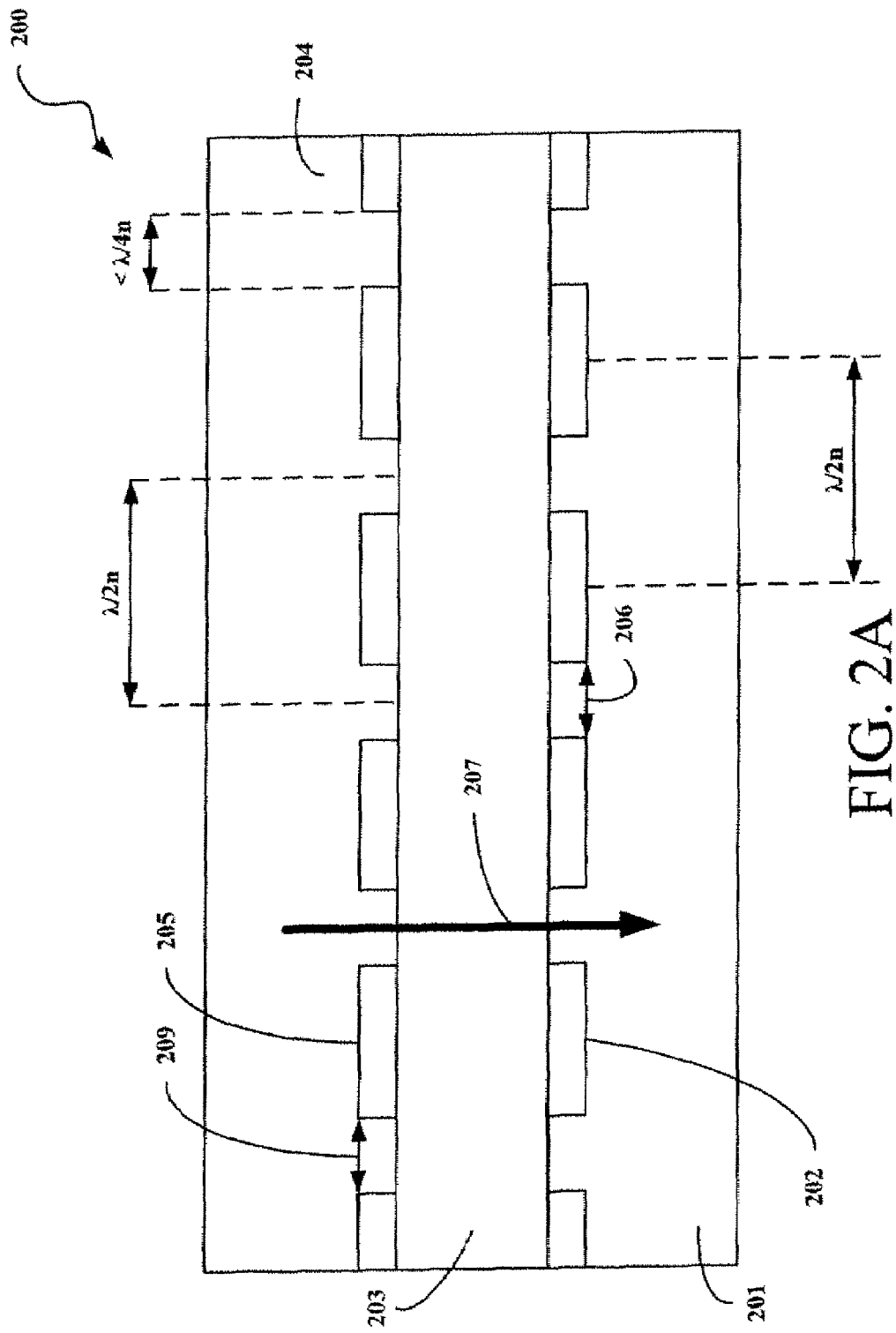
FIG. 2A is a schematic diagram depicting a cross-sectional view of another embodiment of a laser system.
Figure 2B:
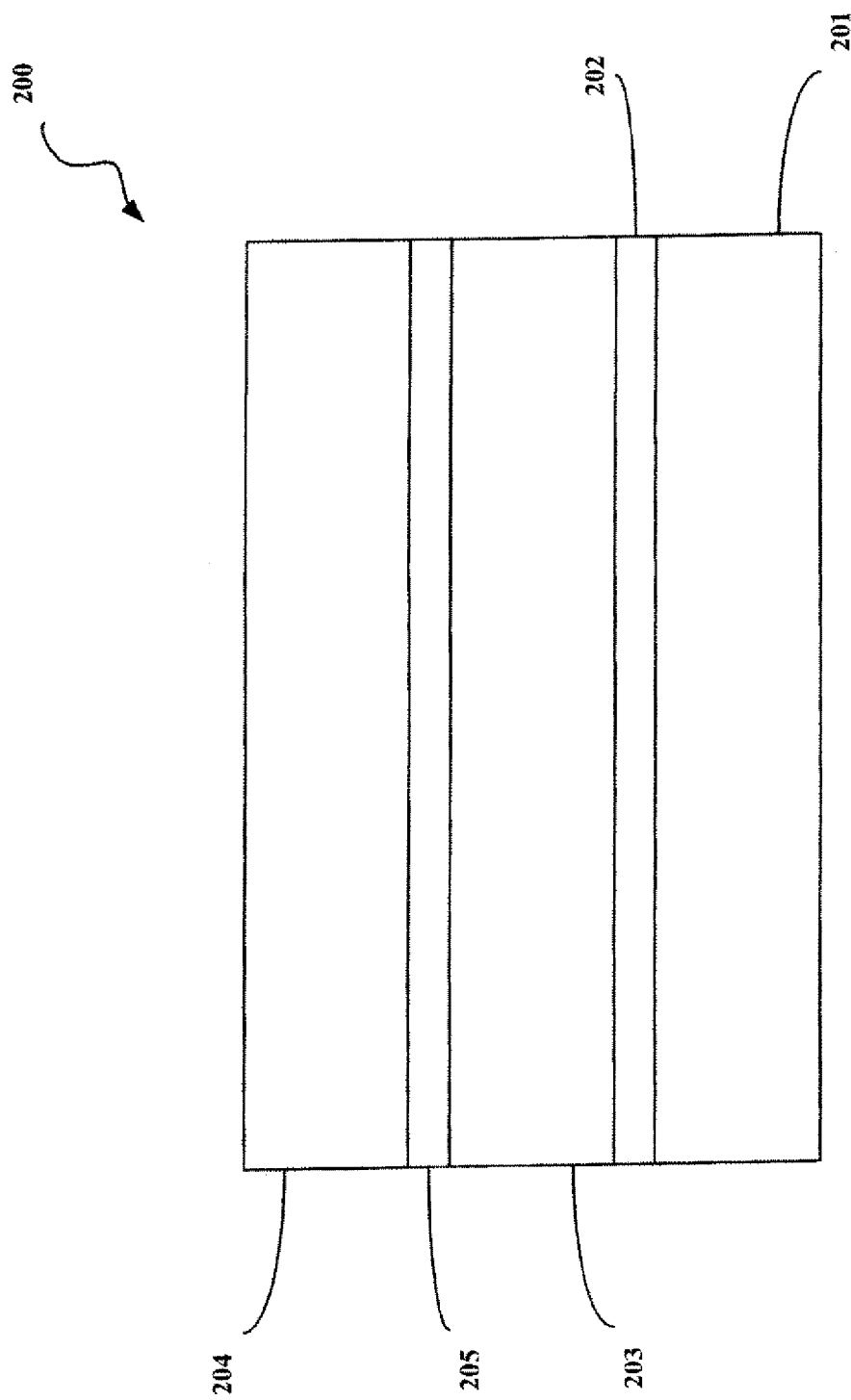
FIG. 2B is a schematic diagram depicting an end view of the embodiment shown in FIG. 2A.

FIGS. 2A and 2B are schematic diagrams depicting an embodiment of a laser system 200. FIG. 2A depicts a cross-sectional view, whereas FIG. 2B depicts an end view of the laser system 200. The laser system 200 includes cladding layers 201 and 204, an active layer 203, and current blocking strips 202 and 205. The materials used for each of the system components may be, for example, as listed in Table 1, among other possible materials, depending on a desired implementation. The current blocking strips 202 are located within an upper portion of the cladding layer 201, whereas the current blocking strips 205 are located within a lower portion of the cladding layer 204.

The active layer 203 is located between the cladding layers 201 and 204 as well as between the current blocking strips 202 and 205. Having the current blocking strips 202 and 205 located closer to the active layer 203 reduces the extent of diffusion of the current 207 in a direction that is perpendicular to its general direction of current flow as the current propagates through the layers of the laser system 200.

The current blocking strips 202 and 205 are configured to restrict the current 207 from flowing through areas located between opposing pairs of the current blocking strips 202 and 205. As a result, the current 207 is channeled through gaps 206 located between adjacent current blocking strips 202 and through gaps 209 located between adjacent current blocking strips 205. In one embodiment, the width of each of the gaps 206 and 209 is equal or less than $\lambda/4n$, whereas the distance between the centers of adjacent gaps 206 and 209 is substantially equal to $\lambda/2n$. For example, if n is equal to 3.5, and the oscillation wavelength is from 1100 nm to 1550 nm, the width of the gaps or channels will be on the order of 153.14 to 214.285 nm, or less.

The gaps or channels will be substantially equal to number of nodal or anti-nodal regions in the system and may be relatively large, on the order of, for example, hundreds or thousands of nodes. High precision fabrication of the Fabry-Perot cavity helps the current blocking strips (and the current channels) to be properly positioned with respect to the nodes and anti-nodes to facilitate the production of a single longitudinal wave.

An advantage of this embodiment is increased quantum efficiency as less current is wasted through fluorescence. Another advantage is that it enables locking into a single pre-chosen longitudinal mode that will experience relatively little shift in wavelength responsive to changes in temperature. The current blocking strips also may act as a distributed feedback (DFB) structure that causes a preferred longitudinal mode to oscillate. This embodiment may be useful in many applications where semiconductor lasers are used including, for example, compact disc (CD) and digital video decoder (DVD) data storage functionality, diode-pumped solid state lasers, and optics based telecommunications. This embodiment may be particularly useful for applications where high power, high efficiency, and/or wavelength stability is desired.

This embodiment is applicable to, but not limited to, the laser material systems of $Al_xGa_{1-x}As$ (gallium aluminum arsenide), $(Al_xGa_{1-x})_yIn_{1-y}P$ (aluminum gallium indium phosphide), $(Al_xGa_{1-x})_yAs_{1-y}P$ (aluminum gallium arsenide phosphide), $(In_xGa_{1-x})_yAs_{1-y}P$ (indium gallium arsenide phosphide) and $Al_xGa_{1-x}In_yN_{1-y}$ (aluminum indium gallium nitride) diode laser material systems. An example of the specific materials used in some embodiments of a GaAlAs laser system is illustrated in Table 1 below.

TABLE 1

Materials Used In An Embodiment of A Laser System

| Component | Material |
| --- | --- |
| First electrode | n-type conducting material (e.g., gold) |
| Substrate | n-GaAs (n-type gallium arsenide) |
| Buffer layer | n-GaAs (n-type gallium arsenide) |
| First cladding layer | n-AlGaAs (n-type aluminum allium arsenide) |
| First plurality of current blocking strips | p-GaAs (p-type gallium arsenide) |
| Active layer | AlGaAs (aluminum gallium arsenide) |
| Second cladding layer | p-AlGaAs (p-type aluminum gallium arsenide) |
| Second lurality of current blocking strips | n-GaAs (n-type gallium arsenide) |
| Cap layer | p-GaAs (p-type gallium arsenide) |
| Second electrode | p-type conducting material (e.g., gold) |

The materials used for each of the system components in FIGS. 1A and 1B may be for example, as listed in Table 1, among other possible materials, depending on a desired implementation. However, the embodiments described herein are not limited to the materials listed in Table 1, as different lasers may use different sets of materials. For example, in an $Al_xGa_{1-x}In_yN_{1-y}$ (Aluminum Indium Gallium Nitride) system, the blocking strips may comprise n-GaN (n-type gallium nitride) on the p-side, and p-GaN (p-type gallium nitride) on the n-side. The current blocking strips will preferably include at least one of the elements (e.g., gallium) found in the corresponding cladding layer, and will have an opposite type (e.g., p-type vs. n-type) as the cladding layer.

Figure 3A:
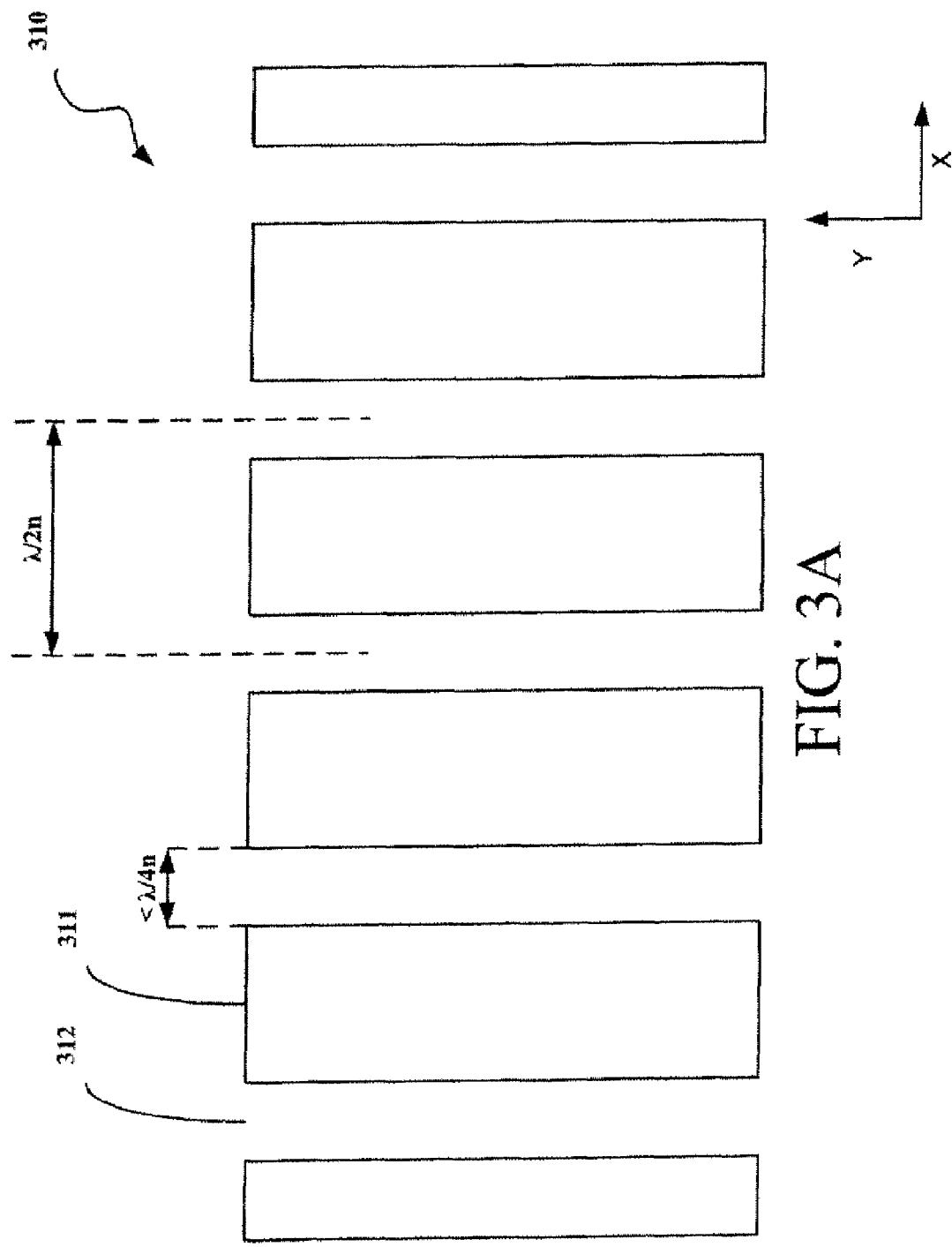
FIG. 3A is a schematic diagram depicting a top view of an embodiment of a current blocking layer.

FIG. 3A is a schematic diagram depicting a top view (showing the x-y plane) of an embodiment of a current blocking layer 310. The current blocking layer 310 includes current blocking strips 311 having gaps 312 between adjacent current blocking strips 311. The width of each of the gaps 312 is less than $\lambda/4n$, whereas the distance between the centers of adjacent gaps 312 is substantially equal to $\lambda/2n$. The number of strips is equal to the mode number q, which is equal to $2nL/\lambda$ where L is the length of the active layer.

Figure 3B:
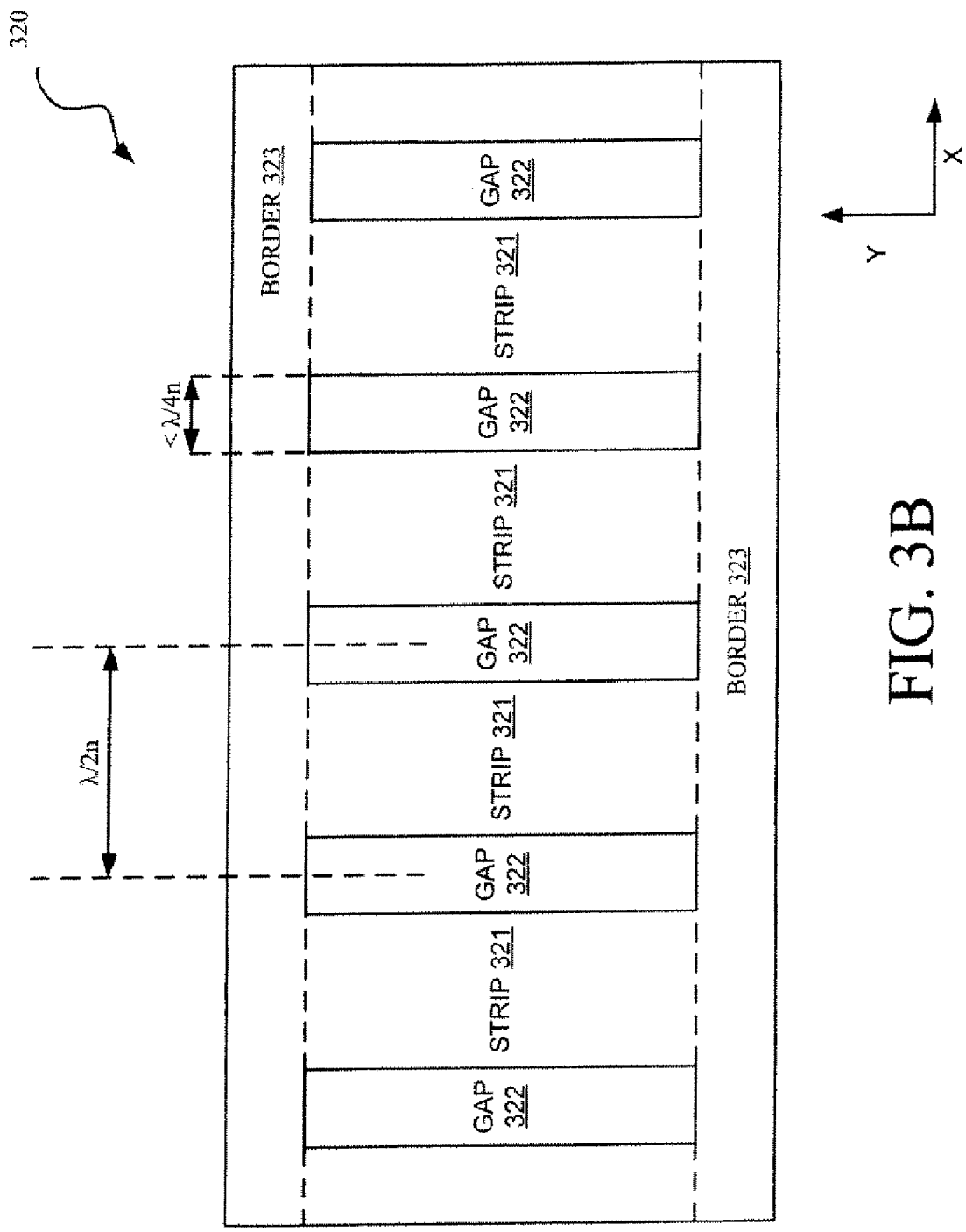
FIG. 3B is a schematic diagram depicting a top view of another embodiment of a current blocking layer.

FIG. 3B is a schematic diagram depicting a top view (showing the x-y plane) of another embodiment of a current blocking layer 320. The current blocking layer 320 includes current blocking strips 321 having gaps 322 between adjacent current blocking strips 321. The width of each of the gaps 322 is less than $\lambda/4n$, whereas the distance between the centers of adjacent gaps 312 is substantially equal to $\lambda/2n$. The blocking layer 320 includes borders 323 (typically formed of the same material as the associated blocking strips) that connect the current blocking strips 321. The borders 323 also serve to confine the current (and the optical transverse mode) in the y-direction. The number of current blocking strips 321 is equal to the mode number q.

Figure 3C:
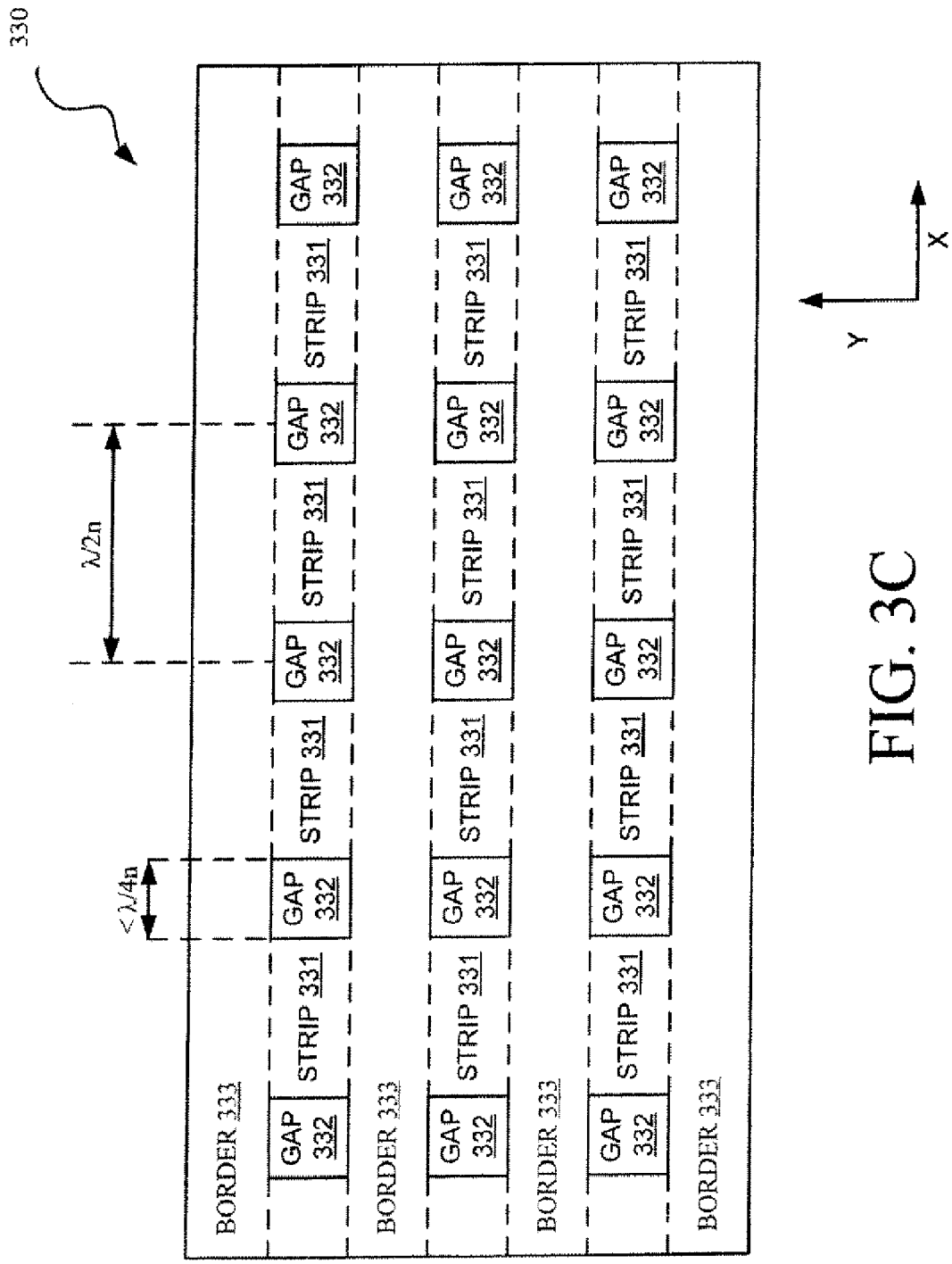
FIG. 3C is a schematic diagram depicting a top view of a further embodiment of a current blocking layer.

FIG. 3C is a schematic diagram depicting a top view (showing the x-y plane) of a further embodiment of a current blocking layer 330. The current blocking layer 330 includes arrays of current blocking strips 331 having gaps 332 between adjacent current blocking strips 331. The width of each of the gaps 332 is less than $\lambda/4n$, whereas the distance between the centers of adjacent gaps 312 is substantially equal to $\lambda/2n$. The current blocking layer 330 can be used in a laser system configured to emit an array of radiation in a fixed and predictable phase relationship. The blocking layer 330 includes borders 333 that connect the current blocking strips 321. The number of current blocking strips 331 is equal to the mode number q.

Figure 4A:
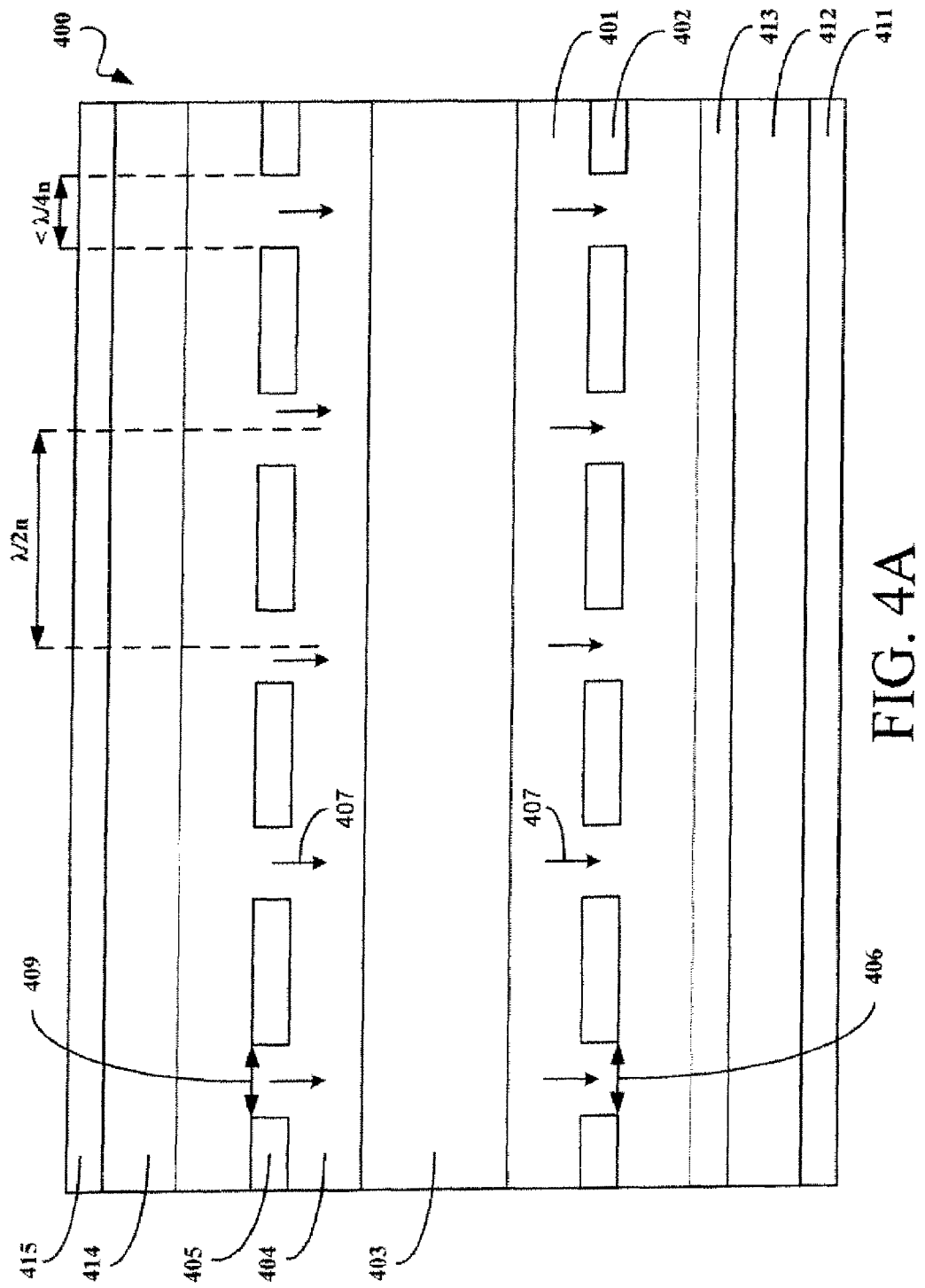
FIG. 4A is a schematic diagram depicting a cross-sectional view of an embodiment of a laser system.

FIG. 4A is a schematic diagram depicting a cross-sectional view of an embodiment of a laser system 400. The laser system 400 includes cladding layers 401 and 404, an active layer 403, current blocking strips 402 and 405, an n-type electrode 411, a substrate 412, a buffer layer 413, a cap layer 414, and a p-type electrode 415. The materials used for each of the system components may be, for example, as listed in Table 1, among other possible materials, depending on a desired implementation.

The current blocking strips 402 are located within the cladding layer 401, whereas the current blocking strips 405 are located within the cladding layer 404. The active layer 403 is located between the cladding layers 401 and 404. The substrate 412 is located between the n-type electrode 411 and the buffer layer 413. The buffer layer 413 is located between the first cladding layer 401 and the substrate 412. The cap layer 414 is located between the second cladding layer 404 and the p-type electrode 415. The laser system 400 is configured such that a current flows from the p-type electrode 415 to the n-type electrode 411. The materials used for each of the system components may be, for example, as listed in Table 1, among other possible materials, depending on a desired implementation.

The current blocking strips 402 and 405 are configured to restrict the current 407 from flowing through an area directly between opposing current blocking strips 402 and 405. As a result, the current 407 is channeled through gaps 406 located between adjacent current blocking strips 402 and through gaps 409 located between adjacent current blocking strips 405. In one embodiment, the width of each of the gaps 406 and 409 is less than $\lambda/4n$, whereas the distance between the centers of adjacent gaps 406 and 409 is substantially equal to $\lambda/2n$.

Figure 4B:
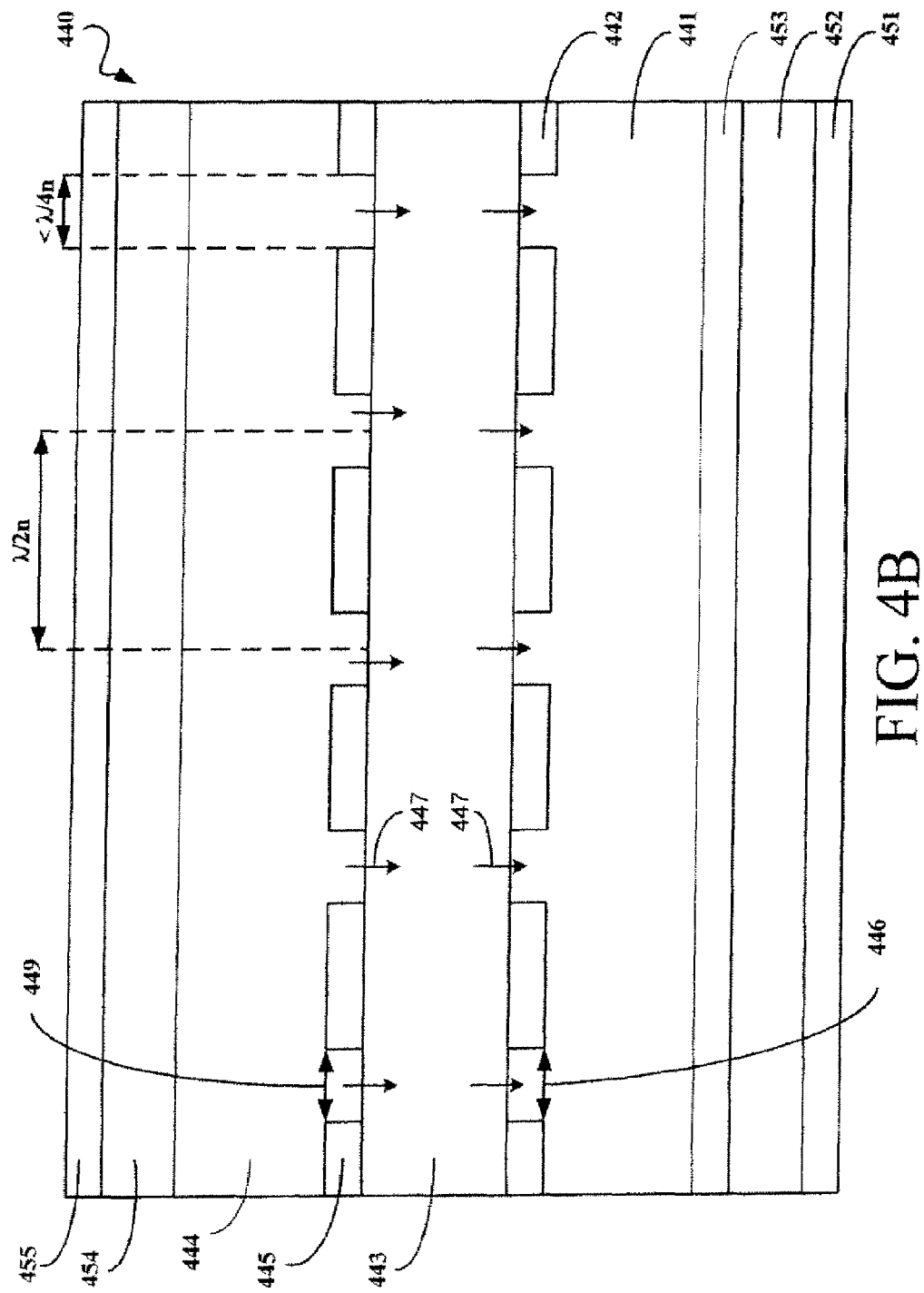
FIG. 4B is a schematic diagram depicting a cross-sectional view of another embodiment of a laser system.

FIG. 4B is a schematic diagram depicting another cross-sectional view of an embodiment of a laser system 440. The laser system 440 includes cladding layers 441 and 444, an active layer 443, current blocking strips 442 and 445, an n-type electrode 451, a substrate 452, a buffer layer 453, a cap layer 454, and a p-type electrode 455. The materials used for each of the system components may be, for example, as listed in Table 1, among other possible materials, depending on a desired implementation.

The substrate 452 is located between the n-type electrode 451 and the buffer layer 453. The buffer layer 453 is located between the first cladding layer 441 and the substrate 452. The cap layer 454 is located between the second cladding layer 444 and the p-type electrode 455. The laser system 440 is configured such that a current flows from the p-type electrode 455 to the n-type electrode 451.

The current blocking strips 442 are located within an upper portion of the cladding layer 441, whereas the current blocking strips 445 are located within a lower portion of the cladding layer 444. The active layer 443 is located between the cladding layers 441 and 444 as well as between the current blocking strips 442 and 445. Having the current blocking strips 442 and 445 located closer to the active layer 443 reduces the extent of diffusion (not shown in FIG. 4B) of the current 447 in a direction that is perpendicular to the general direction of current flow as the current propagates through the layers of the laser system 440. In one embodiment, the width of each of the gaps 446 and 449 is less than $\lambda/4n$, whereas the distance between the centers of adjacent gaps 446 and 449 is substantially equal to $\lambda/2n$.

Figure 5:
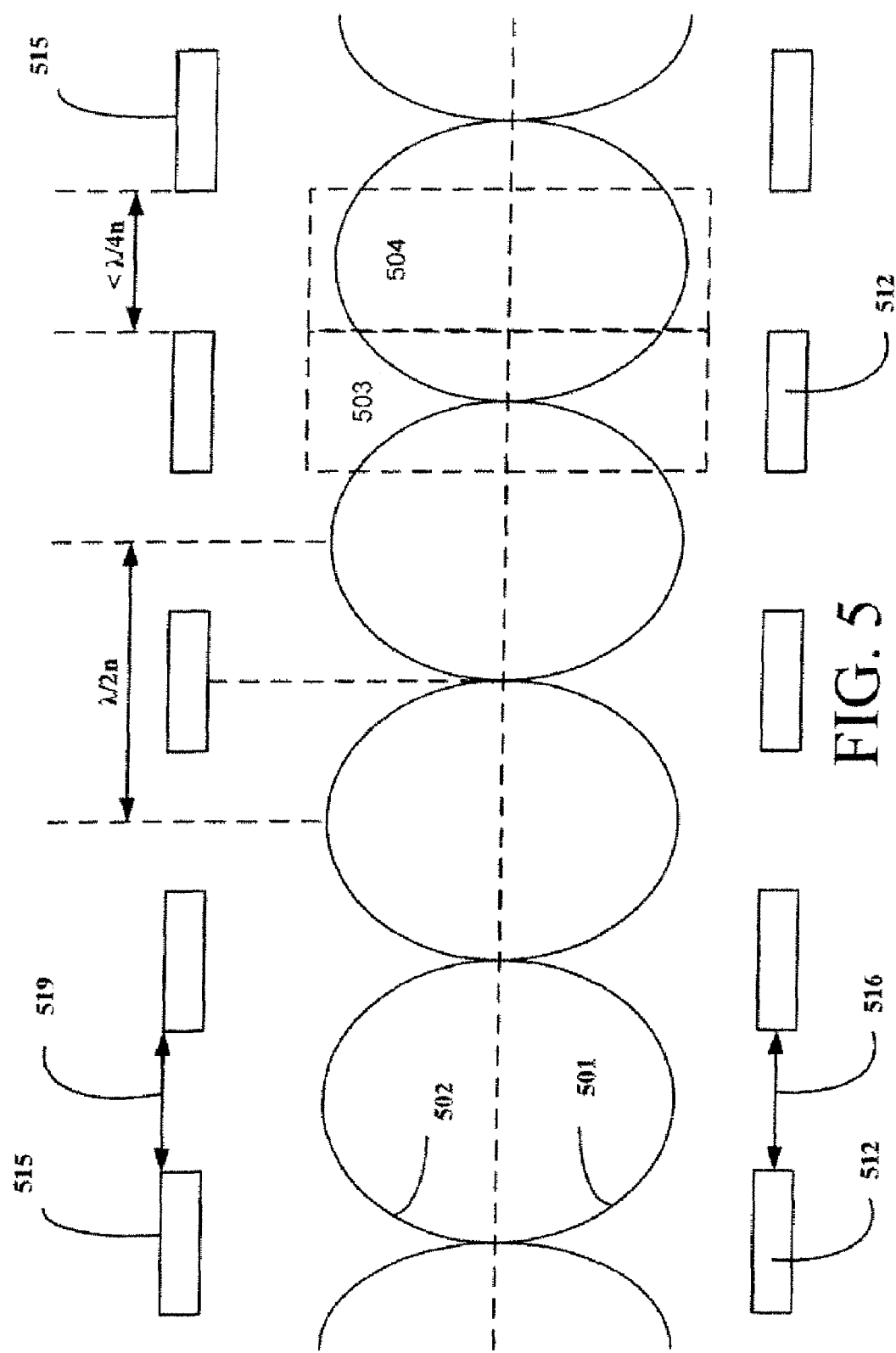
FIG. 5 is a schematic diagram depicting an embodiment of the relative alignment of standing optical waves and current blocking strips in a laser system.

FIG. 5 is a schematic diagram depicting the relative alignment of standing optical waves and current blocking strips in an embodiment of a laser system. In this embodiment, the distance between the centers adjacent gaps 516 (and between the centers of adjacent gaps 519) is substantially equal to $\lambda/2n$, where $\lambda$ is the wavelength of the optical waves 501 and 502 that the laser system is configured to generate. Similarly, the distance between the centers of most adjacent current blocking strips 512 (and between adjacent current blocking strips 515, and excluding the current blocking strips 512 and 515 at the ends of the laser system) is substantially equal to $\lambda/2n$. This restricts the current from flowing through the nodal region 503 of the optical waves 501 and 502. The width of each of the gaps 516 and 519 is preferably less than $\lambda/4n$. This enables the current flowing through the active layer to be concentrated in the anti-nodal region 504 of the optical waves 501 and 502. The number of current blocking strips 515 is equal to the mode number q.

Figure 6:
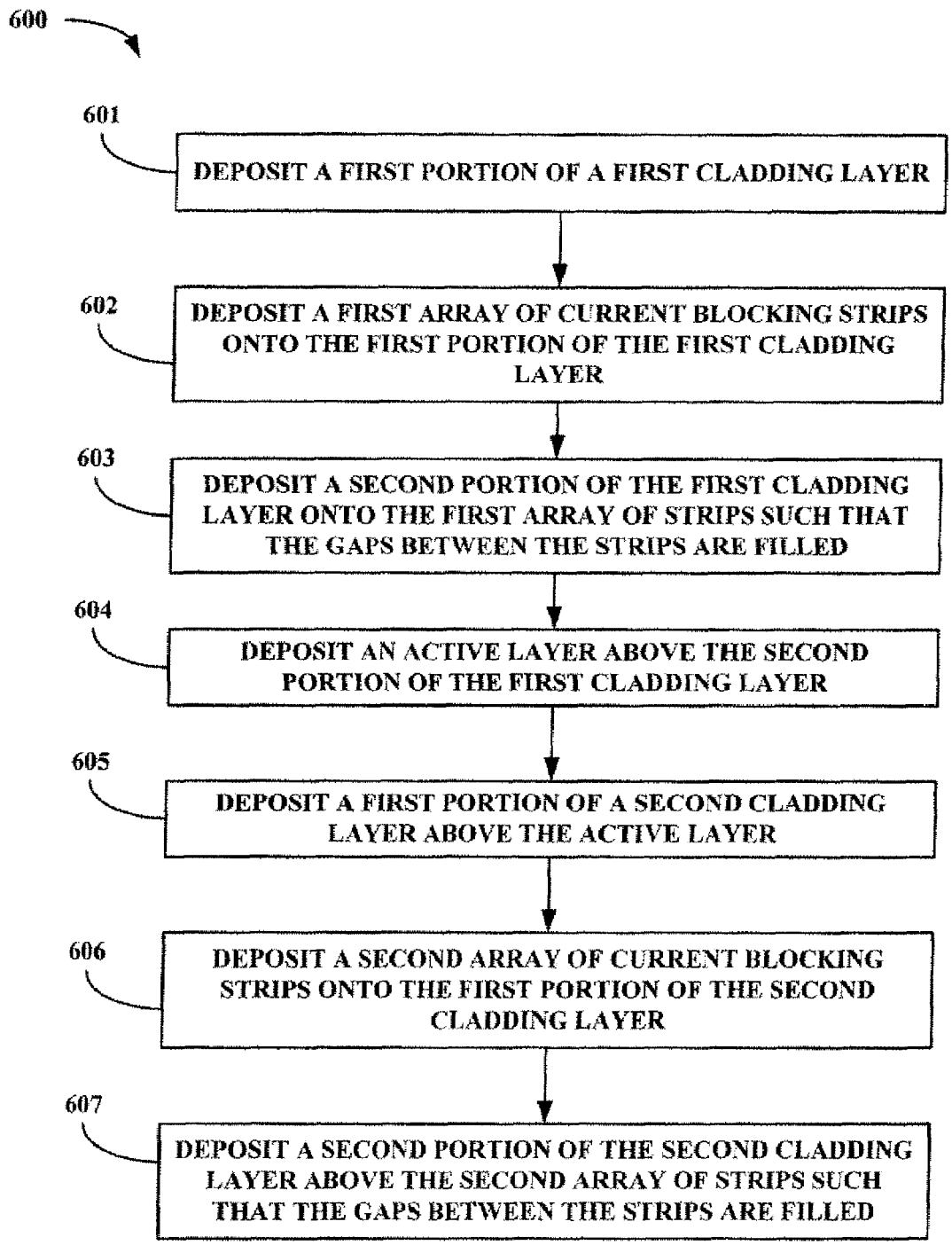
FIGS. 6-8 are flow charts depicting respective embodiments of methods for constructing laser systems.

FIG. 6 is a flow chart depicting an embodiment of a method 600 for constructing a laser system. The materials used in each of the steps 601-607 may be, for example, in accordance with Table 1 above. Other layers of the laser system not mentioned in the method 600 may be fabricated according to any desirable method now known or later developed. According to the first step 601 of the method 600, a first portion of a first cladding layer is deposited. According to step 602, a first array of current blocking strips is deposited onto the first portion of the first cladding layer. According to step 603, a second portion of the first cladding layer is deposited onto the first array of strips. As a result, the gaps between adjoining strips are filled with cladding material which now surrounds most of the first array of strips. According to step 604, an active layer is deposited above the second portion of the first cladding layer. According to step 605, a first portion of a second cladding layer is deposited above the active layer. According to step 606, a second array of current blocking strips is deposited onto the first portion of the second cladding layer. According to step 607, a second portion of the second cladding layer is deposited above the second array of strips. As a result, the gaps between adjoining strips are filled with cladding material which now surrounds most of the second array of strips.

An embodiment of a laser system may be constructed by a variety of techniques including, but not necessarily limited to, MBE (Molecular Beam Epitaxy), MOCVD (Metal-Organic Chemical Vapor Deposition), MOMBE (Metal-Organic Molecular Beam Epitaxy), ALE (Atomic Layer Epitaxy), or VPE (Vapor Phase Epitaxy). The current blocking strips (or layers) can be formed by a method such as, but not limited to, ion beam implantation or any method that is capable of producing high-resistivity areas at submicron resolution in the manner(s) disclosed herein. The normal growth process may be interrupted to form the high resistivity areas (e.g., the current blocking strips).

Figure 7:
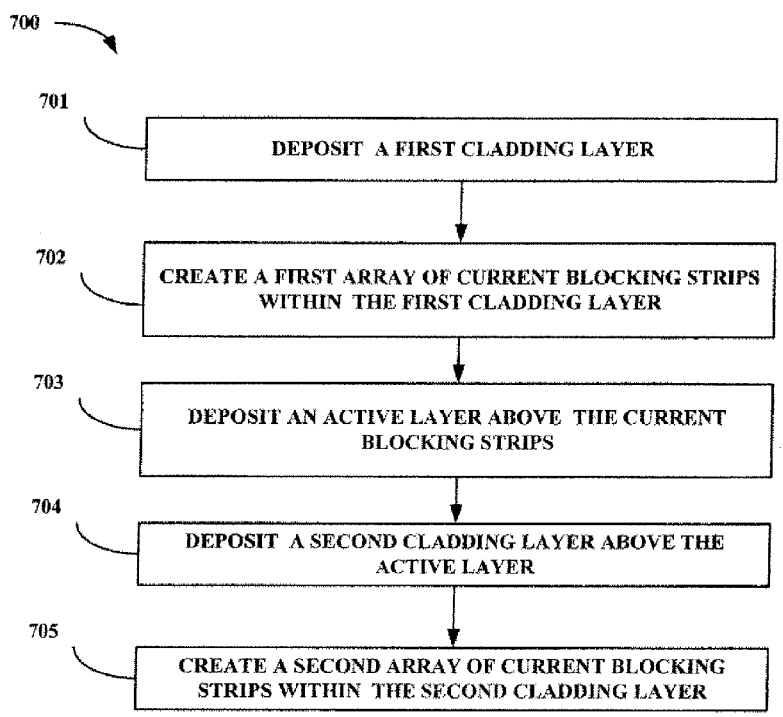

FIG. 7 is a flow chart depicting an embodiment of a method 700 for constructing a laser system. According to step 701, a first cladding layer is deposited. According to step 702, a first array of current blocking strips is created in the first cladding layer by, for example, ion implantation. According to step 703, an active layer is deposited above the current blocking strips. According to step 704, a second cladding layer is deposited above the active layer. According to step 705, a second array of current blocking strips is created in the second cladding layer by, for example, ion implantation. The depositing of the second cladding layer may be paused while the second array of current blocking strips is created.

Figure 8:
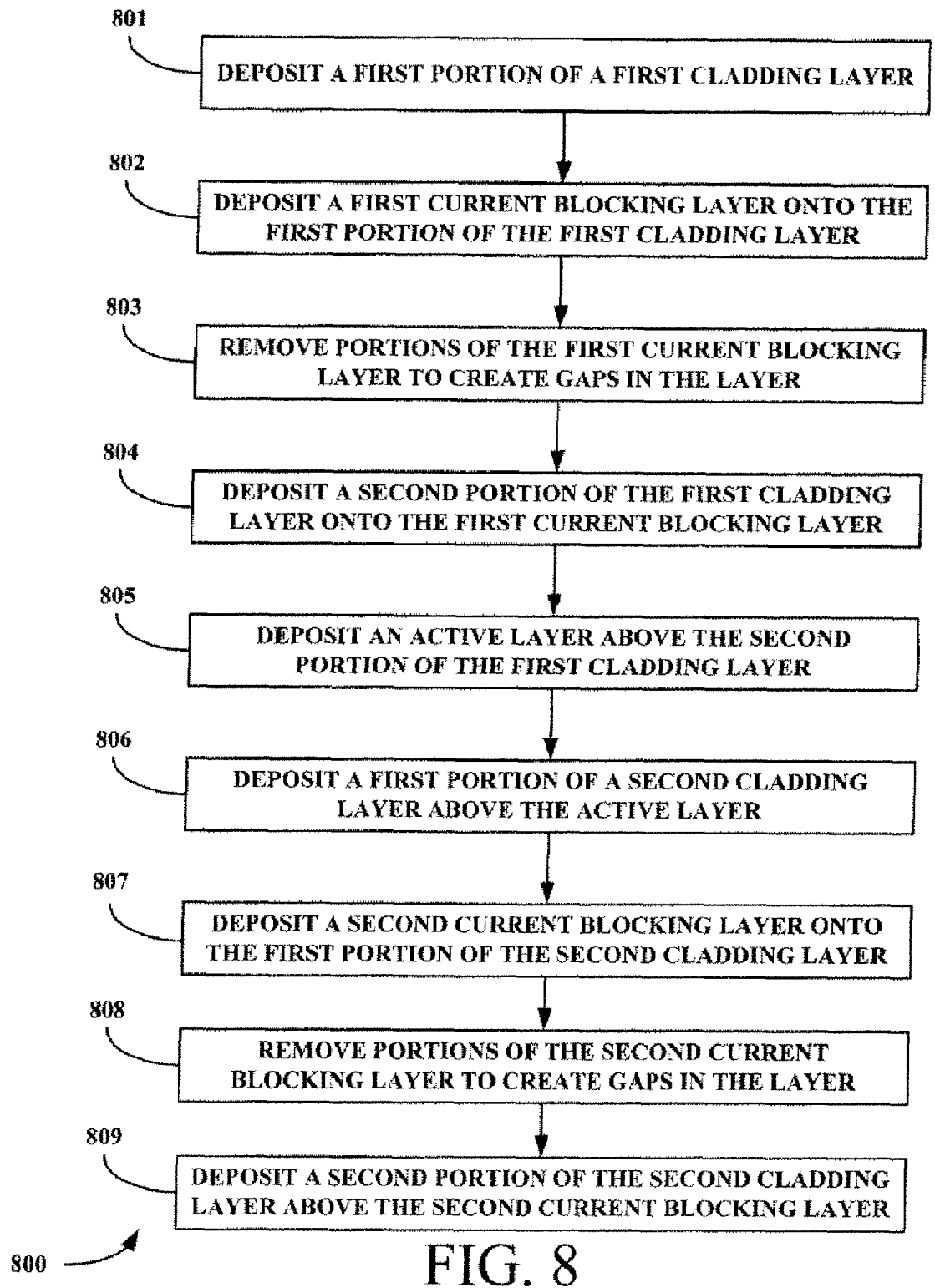

FIG. 8 is a flow chart depicting an alternative embodiment of a method 800 for constructing a laser system. According to step 801, a first portion of a first cladding layer is deposited. According to step 802, a first current blocking layer is deposited onto the first portion of the first cladding layer. According to step 803, portions of the first current blocking layer are removed to create gaps within the current blocking layer. According to step 804, a second portion of the first cladding layer is deposited onto the first current blocking layer such that the gaps in the first current blocking layer are filled, and the first current blocking layer is covered with the second portion of the first cladding layer. According to step 805, an active layer is deposited above the second portion of the first cladding layer. According to step 806, a first portion of a second cladding layer is deposited above the active layer. According to step 807, a second current blocking layer is deposited onto the first portion of the second cladding layer. According to step 808, portions of the second current blocking layer are removed to create gaps within the current blocking layer. According to step 809, a second portion of the second cladding layer is deposited above the second current blocking layer such that the gaps in the second current blocking layer are filled, and the second current blocking layer is covered with the second portion of the second cladding layer.

Figure 9:
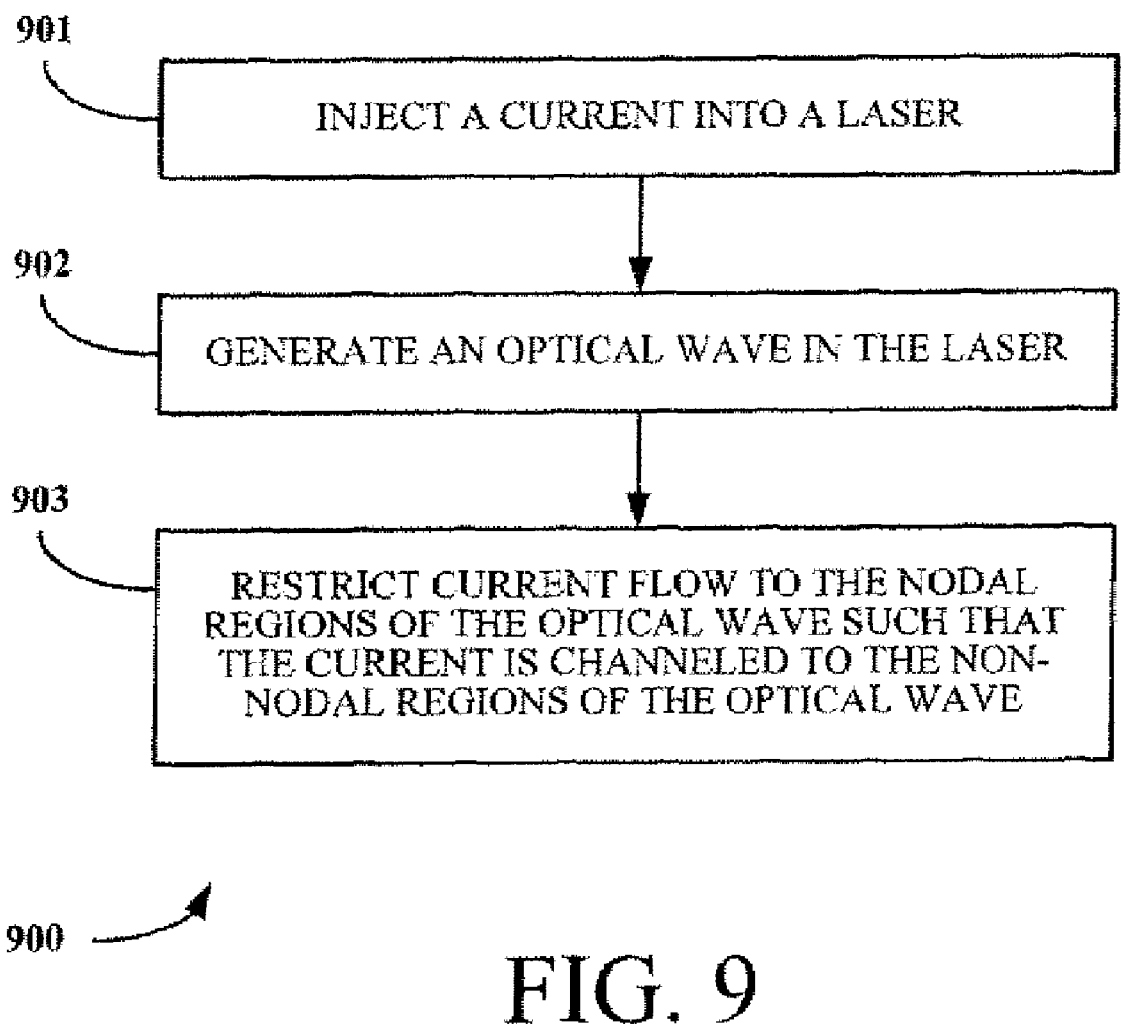
FIG. 9 is a flow chart depicting an embodiment of a method for emitting laser radiation.

FIG. 9 is a flow chart depicting an embodiment of a method 900 for emitting laser radiation. The method 100 includes injecting a current into a laser (step 901), generating an optical wave in the laser (step 902), and restricting current flow to the nodal regions of the optical wave such that the current is channeled to the non-nodal regions of the optical wave (step 903).

It should be emphasized that the above-described embodiments are merely possible examples, among others, of implementations. Many variations and modifications may be made to the above-described embodiments without departing from the scope of the disclosure. All such modifications and variations are intended to be included herein within the scope of the disclosure and protected by the following claims.

What is claimed is:

1. A semiconductor laser comprising:
   a first cladding layer; the first cladding layer comprising a first plurality of current blocking areas having a different level of conductivity than the remainder of the first cladding layer;
   a second cladding layer; the second cladding layer comprising a second plurality of current blocking areas having a different level of conductivity than the remainder of the second cladding layer; and
   an active layer formed of a semiconductor material located between the first and second cladding layers and between the first and second pluralities of current blocking areas;
   first and second reflective surfaces adjacent the active layer configured to form an optical cavity,
   wherein the semiconductor laser is adapted to be connected to a power source for supplying a current flowing perpendicular to optical cavity axis to produce a standing optical wave within the optical cavity having nodal and anti-nodal regions; the first and second plurality of current blocking areas adapted to form channels for the current so as to provide unimpeded current to the anti-nodal regions and to substantially diminish current flow to the nodal regions of a standing wave.

2. The system of claim 1, wherein the first cladding layer is an n-type semiconductor material, the second cladding layer is a p-type semiconductor material, the first current blocking areas are p-type semiconductor material, and the second current blocking areas are n-type semiconductor material, and wherein the first and second blocking areas are positioned apart in a direction parallel to the longitudinal axis of the optical cavity a distance substantially equal to $\lambda/4n$ where n is the refractive index of the active layer, and $\lambda$ is the wavelength of the optical wave, such that current is impeded from traveling to the nodal regions of the standing wave within the active layer.

3. The system of claim 1, further comprising an n-type electrode, a substrate composed of n-type semiconductor material positioned adjacent to the n-type electrode, a buffer layer between the second cladding layer and substrate, a cap layer composed of p-type semiconductor material adjacent to the second cladding layer, and a p-type electrode adjacent to the cap layer, and wherein the first cladding layer is composed of n-type semiconductor material, and the first plurality of current blocking areas are composed of p-type semiconductor material, and the second cladding layer is composed of p-type semiconductor material and the second plurality of current blocking areas are composed of n-type material.

4. The system of claim 2, wherein the first plurality of current blocking areas are embedded in the first cladding layer, and the second plurality of current blocking areas are embedded in the second cladding layer.

5. The system of claim 4, wherein first plurality of current blocking areas comprise a segmented n-GaAs (n-type gallium arsenide) or n-GaN current blocking layer, and the second plurality of current blocking areas comprise a p-GaAs (p-type gallium arsenide) or p-GaN segmented current blocking layer, and wherein the active layer further comprises AlGaAs.

6. The system of claim 1, wherein the first plurality of current blocking areas comprise n-GaAs (n-type gallium arsenide), and the second plurality of current blocking areas comprise p-GaAs (p-type gallium arsenide), and wherein the system further comprises $Al_xGa_{1-x}As$ or $(Al_xGa_{1-x})_yIn_{1-y}P$, where the values of x and y are between 0 and 1, inclusively.

7. The system of claim 1, wherein a distance between centers of adjacent channels located between adjacent areas of the first and second pluralities of current blocking areas is substantially equal to $\lambda/2n$, where n is the refractive index of the active layer, and $\lambda$ is the wavelength of the optical wave.

8. The system of claim 1, wherein the spacing between adjacent areas among the first and second pluralities of current blocking areas is less than or substantially equal to $\lambda/4n$, where n is the refractive index of the active layer, and where $\lambda$ is the wavelength of the optical wave.

9. The system of claim 1, wherein the standing optical wave produced in the optical cavity has a number of nodes in the range of 500-1500 and the spacing between the first and second pluralities of current blocking areas is in the direction parallel to the longitudinal axis of the optical cavity is in the range of 50 to 250 nm.

10. The system of claim 1 wherein the entire system is approximately 0.5 mm in length and 0.25 mm in height and width.

11. A semiconductor laser comprising:
a first cladding layer; the first cladding layer comprising a first plurality of current channeling areas;
a second cladding layer; the second cladding layer comprising a second plurality of current channeling areas; and
an active layer formed of a semiconductor material located between the first and second cladding layers and between the first and second pluralities of current channeling areas;
first and second reflective surfaces adjacent the active layer configured to form an optical cavity,
wherein the semiconductor laser is adapted to be connected to a power source for supplying a current flowing perpendicular to optical cavity axis to produce a preselected standing optical wave within the optical cavity having nodal and anti-nodal regions; the first and second plurality of current channeling areas adapted to channel the current to the anti-nodal regions and to substantially diminish current flow to the nodal regions of a standing wave produced in the optical cavity to thereby establish an optical mode for a selected wavelength.

12. The system of claim 11 wherein the current channeling areas are formed by positioning semiconductor current blocking materials in the first and second cladding layers which are formed from n-type and p-type semiconductor materials respectively.

13. The system of claim 12 wherein p-type semiconductor material current blocking material is placed in or adjacent to the n-type cladding layer and n-type semiconductor material is positioned in or adjacent to the p-type cladding layer and the current channels are formed by the spacing between the current blocking materials.

14. The system of claim 11 wherein the width of the channels is substantially equal to $\lambda/4n$ where n is the refractive index of the active layer, and $\lambda$ is the wavelength of the longitudinal mode optical wave.

15. The system of claim 14, wherein the standing optical wave produced in the optical cavity has a number of nodes in the range of 500-1500 per mm, and for substantially all anti-nodal regions, there is a corresponding channel substantially perpendicular to the longitudinal axis of the optical cavity.

16. A method for emitting laser radiation comprising: injecting current into a semiconductor laser, generating an optical wave in the laser, restricting current flow to the nodal regions of the optical wave and channeling current to the non-nodal regions of the optical wave; wherein the current flow to the nodal regions is limited by positioning first and second plurality of areas on opposing sides of an active layer, in which the optical wave is generated, wherein the first and second plurality of areas exhibit lower conductivity with respect to corresponding surrounding material.

17. The method of claim 16, wherein the first plurality of areas comprise n-GaAs (n-type gallium arsenide), and the second plurality of areas comprise p-GaAs (p-type gallium arsenide), and wherein the laser further comprises active and cladding layers formed by $Al_xGa_{1-x}As$ or $(Al_xGa_{1-x})_yIn_{1-y}P$ where the values of x and y are between 0 and 1, inclusively.

18. The method of claim 16, wherein the first plurality of areas comprise n-GaN (n-type gallium nitride), and the second plurality of areas comprise p-GaN (p-type gallium nitride) and wherein the laser further comprises active and cladding layers formed by $Al_xGa_{1-x}In_yN_{1-y}$ where the values of x and y are between 0 and 1, inclusively.

19. The method of claim 16, wherein a distance between centers of adjacent gaps located between adjacent areas of the first and second pluralities of areas is substantially equal to $\lambda/2n$, where n is the refractive index of the active layer, and $\lambda$ is the wavelength of the optical wave.

20. The method of claim 16, wherein the first plurality of areas are embedded in a first cladding layer, and the second plurality of areas are embedded in a second cladding layer, wherein the first and second cladding layers are on opposing sides of the active layer.

21. The method of claim 16, wherein the plurality of current blocking strips act as a distributed feedback (DFB) stricture that enables a preferred longitudinal mode to oscillate.

22. A method for constructing a semiconductor laser system, comprising:
providing a first cladding layer;
providing a second cladding layer;
embedding a first plurality of areas in the first cladding layer, wherein the first plurality of areas have a different level of conductivity than other regions of the first cladding layer;
embedding a second plurality of areas in the second cladding layer, wherein the second plurality of areas have a different level of conductivity than other regions of the second cladding layer; and
providing an active layer between the first and second cladding layers;
wherein the active layer is configured to produce an optical wave having a plurality of nodes; and
wherein each of the plurality of nodes is located between a corresponding one of the first plurality of areas and a corresponding one of the second plurality of areas.

23. The method of claim 22, wherein the first and second pluralities of areas are configured to channel a current into anti-nodal regions of the optical wave.

24. The method of claim 22, wherein the first plurality of areas comprise n-GaAs (n-type gallium arsenide), and the second plurality of areas comprise p-GaAs (p-type gallium arsenide), and wherein the active and cladding layers are formed from $Al_xGa_{1-x}As$ or $(Al_xGa_{1-x})_yIn_{1-y}P$, where the values of x and y are between 0 and 1, inclusively.

25. The method of claim 22, wherein a distance between centers of adjacent gaps located between adjacent areas of the first and second pluralities of areas is substantially equal to $\lambda/2n$, where n is the refractive index of the active layer, and K is the wavelength of the optical wave.

26. The method of claim 22, wherein a spacing between adjacent areas among the first and second pluralities of areas is equal to $\lambda/4n$, where n is the refractive index of the active layer, and where $\lambda$ is the wavelength of the optical wave.

* * * * *